United States Patent
Bajic (10) Patent No.: US 9,251,566 B1
(45) Date of Patent: *Feb. 2, 2016

(54) METHOD AND SYSTEM FOR HIGH-RESOLUTION TRANSFORMS OF FREQUENCY-SPACE AND INVERSE FREQUENCY-SPACE DATA

(71) Applicant: Ivan Bajic, San Diego, CA (US)

(72) Inventor: Ivan Bajic, San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/935,491

(22) Filed: Nov. 9, 2015

Related U.S. Application Data (63) Continuation-in-part of application No. 14/639,114, filed on Mar. 4, 2015, now Pat. No. 9,183,648.

(60) Provisional application No. 61/947,737, filed on Mar. 4, 2014.

(51) Int. Cl.
  *G06K 9/00* (2006.01)
  *G06T 3/40* (2006.01)
  *G06T 5/50* (2006.01)

(52) U.S. Cl.
  CPC ............. *G06T 3/4084* (2013.01); *G06T 5/50* (2013.01); *G06T 2207/10088* (2013.01); *G06T 2207/20024* (2013.01); *G06T 2207/20056* (2013.01)

(58) Field of Classification Search
  None
  See application file for complete search history.

(56) References Cited

U.S. PATENT DOCUMENTS

| | | | | |
|---|---|---|---|---|
| 9,183,648 B2* | 11/2015 | Bajic | ................ | G06T 11/005 |
| 2003/0215154 A1* | 11/2003 | Pauly | ................ | G01R 33/4824 382/254 |
| 2005/0074152 A1* | 4/2005 | Lewin | ................ | G01R 33/561 382/128 |
| 2006/0247515 A1* | 11/2006 | Moriguchi | ......... | G01R 33/4824 600/414 |
| 2006/0262994 A1* | 11/2006 | Patera | ................ | G06T 3/4084 382/276 |
| 2008/0144900 A1* | 6/2008 | Li | ................ | G01R 33/4824 382/130 |
| 2010/0305424 A1* | 12/2010 | Cook | ................ | A61B 5/055 600/410 |
| 2011/0096092 A1* | 4/2011 | Griswold | ............ | A61B 5/055 345/630 |
| 2015/0126850 A1* | 5/2015 | Cetingul | ............ | A61B 5/7289 600/413 |

OTHER PUBLICATIONS

Hoge et al. "Density Compensation Functions for Spiral MRI," 1997, MRM 38: pp. 117-120.*
Intel Math Kernel Library Cookbook, "Using Fast Fourier Transforms for computer tomography image reconstruction," Aug. 30, 2014.*

* cited by examiner

*Primary Examiner* — Vu Le
*Assistant Examiner* — Samah Beg (57) ABSTRACT

A method and system for high-resolution and parallelizable data processing, reconstruction, and deconstruction, uses arbitrary frequency-space (FS) or inverse frequency-space (IFS, such as image, audio, or video space) sample points in N dimensions. According to a preferred embodiment of the invention, a subset of optionally pre-processed and/or pre-conditioned N-dimensional FS data (or IFS data) is acquired (102) by a processing device (360), the data is optionally transformed (115) by "region scaling factors", and the data is optionally reduced (116) in numerical significant digits. A "horizontal key" of data elements is calculated (120) on a processor (361), preferably in parallel, for each of an arbitrary set of x-coordinates in IFS (or FS). IFS "color" data (or FS data) are calculated (130) on a processor (361), preferably in parallel, at the x-coordinates corresponding to the horizontal keys. The IFS coordinates (or the FS coordinates) are arbitrary, and the reconstruction's calculated IFS data (or the deconstruction's calculated FS data) are optionally rotated or transposed (141) (such as for display purposes), and are thus formed (150) in a memory (363) or on an output device (365). The method can be applied to other subsets, such as in the N-dimensional case.

12 Claims, 3 Drawing Sheets

METHOD AND SYSTEM FOR HIGH-RESOLUTION TRANSFORMS OF FREQUENCY-SPACE AND INVERSE FREQUENCY-SPACE DATA

CROSS-REFERENCE TO RELATED APPLICATIONS

This application is a continuation-in-part of U.S. application Ser. No. 14/639,114, filed 4 Mar. 2015 (and which is hereby incorporated by reference herein in its entirety), which claims the benefit of U.S. Provisional Application No. 61/947,737, filed 4 Mar. 2014 (and which is hereby incorporated by reference herein in its entirety). Furthermore, as per 37 CFR 1.71: A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

STATEMENT REGARDING FEDERALLY SPONSORED RESEARCH OR DEVELOPMENT

Not Applicable.

REFERENCE TO A COMPUTER PROGRAM LISTING APPENDIX

A computer program listing appendix is submitted herewith, as electronic text files, and is incorporated herein by reference in its entirety.

The names, dates, and sizes for the files contained in the computer program listing appendix are:

prog1.txt, 8 Nov. 2015, 10975 bytes;
prog2.txt, 8 Nov. 2015, 7615 bytes; and
prog3.txt, 8 Nov. 2015, 5197 bytes.

The file prog1.txt contains a listing of a computer program that implements an exemplary embodiment of preferred approach Option 1, which is the HRGB method implemented on a CPU-based computer system; in this case, a multi-threaded computer program parallelized for a multi-core CPU-based system.

The file prog2.txt contains a listing of a computer program that implements an exemplary embodiment of preferred approach Option 2, which is the HRGB method implemented on a parallel electronic circuit; in this case, a computer program parallelized for a GPU/GPGPU.

The file prog3.txt contains a listing of a computer program that implements an exemplary transformation of complex-color data to integer-color data, and offering multiple such options, such as for displaying the method's results on a display device or when creating a binary image file.

The program files are copyrighted by the inventor, as per 37 CFR 1.71.

BACKGROUND OF THE INVENTION

1. Field of the Invention

The present invention relates generally to medical, industrial, scientific, and multi-media imaging and related arts, and more particularly, to a method and system for processing, reconstructing, or deconstructing acquired N-dimensional frequency-space data or image/audio/video-space data (inverse frequency-space data, in general), by the application of a high-resolution and parallelizable processing, reconstruction, and deconstruction method.

2. Description of Related Art

In many areas of science and technology, the processing and analysis of data depend on time-frequency and spatial-frequency analyses. This is true in everything from molecular analysis to image, audio, and video processing and compression. The primary techniques for such tasks are the Fast Fourier Transform (FFT) and wavelet transforms. For example, the FFT is the process of choice for many image/audio/video compression techniques (JPEG images, MP3 audio, MPEG video, etc.), and wavelets are the basis for JPEG2000 image compression. The FFT is the most popular technique for time-frequency or spatial-frequency analysis, but it is known for certain limitations—in particular, the FFT permits only specific sets of frequencies, which are all integer multiples of a single fundamental frequency, $1/N_s$, where $N_s$ is typically the number of sample points in the time or space domain. To get high resolution in FFT frequency analysis, the number of samples $N_s$ must be correspondingly large. Wavelets offer better resolution, but are typically limited to logarithmically-spaced frequencies.

Since the FFT is limited to specific sets of frequencies, any non-uniform frequency-space data must be aligned with such frequencies. (Non-uniform data is, for example, associated with spiral and radial MRI scans (magnetic resonance imaging), and CT scans (computed tomography) in general. In the field of MRI/fMRI, spiral and radial scanning patterns are typically faster than other types of patterns, and the images produced are less susceptible to errors caused by motion during the scanning process.) The most common technique for this alignment of non-uniform data is known as gridding. Although gridding is fast computationally, it is known in the art for generating image artifacts (image errors) that corrupt the reconstructed images. Newer techniques, such as the Non-Uniform FFT (NUFFT) or conjugate gradient, or traditional techniques such as back-projection approaches, attempt to eliminate the need for gridding, but these techniques are generally approximation techniques, using approaches such as least squares, interpolation, or iteration. In complex cases, iterative techniques such as conjugate gradient will converge to an answer slowly, or not at all—so, although the reconstructed images are more accurate, they might require minutes or hours of computation. The goal, then, is to find a way to transform data, such that the results exhibit no gridding artifacts, or negligible gridding artifacts, and such that the results can be computed quickly.

An additional problem in the field is that current reconstruction techniques typically generate images that are small by today's standards. For example, whereas a typical consumer camera can output raw images of sizes such as 4,600-by-3,500 pixels or larger, fMRI machines typically output raw images of size 64-by-64 pixels, and MRI machines typically reconstruct raw images of size 256-by-256 pixels or 512-by-512 pixels. Such low-resolution images are associated with frequency-space based medical imaging technologies in particular, including MRI/fMRI, CT, ultrasound, PET (positron emission tomography), and SPECT (single-photon emission computed tomography). These raw images are typically scaled to larger sizes by interpolation techniques, so that radiologists can better see the results of the scans, but interpolation is an approximation technique that increases the image size on the display by essentially stretching the low-resolution image, not by generating a large raw image. The goal, then, is to find a way to process frequency-space data, so that the raw reconstructed images can be arbitrarily large. In the case of medical imaging, this can allow radiologists to get a better look at areas of interest, and would also allow them to "zoom in" to enlarge a particular sub-region.

An additional problem in the field is that true 3-dimensional ("true 3D", also known as "full 3D") or true N-dimensional (multi-dimensional) frequency-space data is associated with slow computations in industrial, medical, and scientific applications. For example, for MRI, true 3D scans offer higher resolution than the more common technique of multiple and adjacent 2D scans, but it is less popular in practice largely due to the slower scans and reconstructions associated with this imaging technique. 3D and multi-dimensional scans and frequency-space data are also associated with scientific applications, such as protein analysis, and with industrial applications, such as ground penetrating radar, seismic analysis, cartography, and oil, gas, and water exploration. (It is noted here that such applications also frequently process data in fewer than 3 dimensions, but the 3D and multi-dimensional cases are the most challenging in terms of computation speed.) The goal, then, is to find a way to process 3D or multi-dimensional frequency-space data, so that the reconstructed images, or data, can be computed quickly.

SUMMARY OF THE INVENTION

The following summary will discuss exemplary embodiments of a method and system for frequency-space based and image/audio/video-space based image, audio, and video processing and reconstruction. The method is herein referred to as the HRGB method (High-Resolution, General Basis).

In brief, the HRGB method and system transforms acquired N-dimensional frequency-space data to image/audio/video data (a process known as data reconstruction), and also transforms acquired N-dimensional image/audio/video data to frequency-space data (a process herein referred to as data deconstruction or as data processing), such that the computations can be highly parallelized, and such that the resulting data exhibit negligible gridding errors and arbitrarily high resolutions.

The HRGB method and system for data processing and reconstruction, particularly in the context of medical and industrial imaging, uses arbitrary frequency-space or image/audio/video-space (inverse frequency-space) sample points in N dimensions. According to a preferred embodiment of the invention, a subset of optionally pre-processed and pre-conditioned N-dimensional frequency-space (or image/audio/video-space) data is acquired by a processing device, the data is optionally transformed by region scaling factors, and the data is optionally reduced in numerical significant digits. A "horizontal key" of data elements is calculated on a processor, preferably in parallel, for each of an arbitrary set of x-coordinates in image/audio/video-space (or frequency-space). Image/audio/video-space "color" data (or frequency-space data) are calculated on a processor, preferably in parallel, at the x-coordinates corresponding to the horizontal keys. The image/audio/video-space coordinates (or the frequency-space coordinates) are arbitrary, and the reconstruction's calculated image/audio/video data (or the deconstruction's calculated frequency-space data) are optionally transposed (such as for display purposes), and are thus formed, with arbitrary resolutions, in a memory or on an output device. The method can be applied to other subsets, such as in the N-dimensional case.

According to an embodiment of the invention, the HRGB method can be implemented as software on CPU-based computer systems, preferably with multi-core CPUs since the HRGB method is designed to be highly parallelizable. According to another embodiment of the invention, the HRGB method can be implemented on a parallel electronic circuit, such as an FPGA (Field-Programmable Gate Array) or ASIC (Application-Specific Integrated Circuit), as well as on computer systems that support parallel-computation hardware such as a GPU (graphics processing unit) or GPGPU (general purpose GPU).

The method starts with a set of acquired, N-dimensional, frequency-space or image/audio/video-space data items, typically in the context of medical, industrial, or scientific imaging, or audio or video processing. (It should be noted that frequency-space is also known in the art as Fourier space, and in the context of MRI/fMRI imaging is also known as k-space, and is also sometimes referred to as time-frequency or spatial-frequency space in the context of audio or image data.) As is typical for data in image/audio/video-space or frequency-space, each data item comprises two parts: a coordinate position in frequency-space or image/audio/video-space, notated herein as $(k_1, k_2, \ldots, k_N)$, and an associated complex-numbered data value, $a+i\,b$. For notational purposes, each of the data items, or samples, is herein written in the form $\{k_1, k_2, \ldots, k_N; a, b\}$, where $(k_1, k_2, \ldots, k_N)$ is the frequency-space or image/audio/video-space coordinate of the data item, and $<a, b>$ is the complex-numbered data value, $a+i\,b$, associated with that coordinate. The brackets notation $<n_1, n_2>$ is used herein to represent a complex-numbered value $n_1+i\,n_2$, where as in the art, the symbol $i$ represents $i^2=-1$. (For notational purposes, the common engineering notation $j^2=-1$ will be used in place of $i^2=-1$, and $i$ will be used as an index.)

A subset, or slice, of the N-dimensional data is then considered. In a preferred embodiment of the invention, and also for notational purposes, the subset is assumed as a 2-dimensional (2D) slice in the x-y plane (in frequency-space or image/audio/video-space), although in practice any other slice orientation is acceptable (in MRI imaging in particular, the x-y-z axes can be chosen arbitrarily and obliquely). Although a 1-dimensional (1D) slice is also acceptable in an embodiment of the invention, as a reduced case of a 2D slice (for example, ignoring the method's y-axes in frequency-space and in image-space by choosing them as equal to 0—such as for 1D data such as audio or general signal data), a 2D slice of the N-dimensional data is a preferred embodiment for medical and industrial applications, since such applications are typically associated with data in two, three, or more dimensions. Without loss of generality, and for notational purposes, it will be assumed that the data items, or sample points, in the 2D (or 1D) slice are each of the form $\{k_1, k_2; a, b\}$, which in the context of MRI/fMRI notation is $\{k_x, k_y; a, b\}$. For notational purposes, this discussion will use the latter notation, $\{k_x, k_y; a, b\}$, to represent the data items in the 2D (or 1D) slice.

As will be seen later, the HRGB method can be applied to frequency-space data, for data reconstruction, and can be applied to image/audio/video-space data, for what is referred to herein as data deconstruction. That is, the HRGB method works in either direction—frequency-space to image/audio/video-space, or image/audio/video-space to frequency-space.

For ease of notation, discussion will without loss of generality now focus on frequency-space to image-space transforms (image data reconstruction) in particular. But, it should be noted that whether transforming frequency-space data to image/audio/video-space data, or whether transforming image/audio/video-space data to frequency-space data, the HRGB method is the same.

According to the rules of Fourier space, the frequency-space data items, or sample points, are contained in a region of frequency-space in the coordinate range $-f_{x,max} \leq k_x < +f_{x,max}$, and $-f_{y,max} \leq k_y < +f_{y,max}$. According to the rules of Fourier space, this corresponds to a region in image-space in the coordinate range $-X_{max} \leq x < +X_{max}$, and $-Y_{max} \leq y < +Y_{max}$. In a preferred embodiment of the invention, for computational efficiency, the $(k_x, k_y)$ coordinates can be multiplied by a scaling factor (herein referred to as a "region scaling factor") such that the frequency-space region and image-space region transform to the same size. That is, the two fields of view, or FOVs, are now aligned. That is, $-R_{max} \leq k_x, k_y, x, y < +R_{max}$. In a preferred embodiment of the invention, this scaling factor is, according to the rules of Fourier space, $(\sqrt{N_s})/(2\ max)$, where max is $f_{x,max}$ or $f_{y,max}$ or $X_{max}$ or $Y_{max}$, as appropriate, and where $N_s$ is $N_x$ or $N_y$, as appropriate, with each according to and as defined by the rules of Fourier space and the art-related context. For example, for image processing, $N_x$ and $N_y$ typically represent the image's width and height in pixels, whereas for MRI/fMRI imaging, $N_x$ and $N_y$ represent the pixel dimensions or the MRI/fMRI scan sizes. For the case of $N_x=N_y=256$, which is typically used in MRI medical imaging (in which case $N_x$ and $N_y$ are the scan sizes along the arbitrarily-chosen x and y coordinate axes), the scaling factor is $16/(2\ max)$, or $8/max$, which then corresponds to the coordinate range $-8 \leq k_x, k_y, x, y < +8$ in frequency-space and in image-space. (In embodiments of the invention, this scaling is preferred for efficiency but is not strictly necessary since, for example, the HRGB method allows selection of arbitrary image-space points for reconstruction).

According to an embodiment of the invention, the $k_x$ and $k_y$ coordinates can be transposed or rotated, or in general swapped, for computational efficiency, such as for parallel-coil SENSE MRI scans for which the number of unique $k_y$-notated coordinate values is typically less than the number of unique $k_x$-notated coordinate values. (That is, optionally reducing the number of $k_x$-notated coordinate values in the data set can in many cases yield speed increases when the method is implemented in practice.)

According to an embodiment of the invention, some or all of the $<a, b>$ data values can be multiplied by density compensation factors, based on the associated coordinates $(k_1, k_2, \ldots, k_N)$, such as those density compensation factors known in the art. (Of course, it is also possible that these density compensation factors were already applied to the raw frequency-space data points, to pre-process them prior to the start of the HRGB method. If not, and if such data processing is desired, the density compensation factors or other such pre-processing or pre-conditioning factors can be applied during the HRGB method.)

According to an embodiment of the invention, for computational efficiency, some or all of the $k_x$ or $k_y$ values (or a or b values) in the data set can be truncated, rounded, or otherwise reduced in their number of significant digits. The fewer significant digits used to represent the values (particularly the $k_x$ values), the faster the computations, although there is an associated increase in image artifacts. In practical applications of the HRGB method, such artifacts are generally negligible.

Whether or not the optional pre-processing or pre-conditioning of the frequency-space data items is applied, and whether it is applied prior to or after the start of the method, the frequency-space data items $\{k_x, k_y; a, b\}$ are implicitly or explicitly associated in the following way. There are n unique $k_x$ values, each associated with (herein also referred to as "paired with") a set of corresponding $k_y$ values in the reduced data set (the 2D slice). For example, for data items $\{5,6; 1,1\}$ and $\{5,16; 1,1\}$, there is a single unique $k_x$ value, 5, and it is associated with, or "paired with", two $k_y$ values, 6 and 16. For notational purposes, it is assumed that there are n unique $k_x$ values, $kx_1$ to $kx_n$—that is, a set $kx_i$ for i in the range 1 to n. Each such unique $kx_i$ is associated with a set of corresponding $k_y$ values in the data set—that is, a set $ky_{i,z}$ for z in the range 1 to $L_i$, where $L_i$ is the number of preferably-unique $k_y$ values associated with (paired with) coordinate $kx_i$ in the data set.

For each image-space x-coordinate for which an image point reconstruction is desired, a "horizontal key", res1, is computed. For notational purposes, it is assumed that an arbitrarily-chosen x-coordinate is notated as $p_x$. This image-space x-coordinate is associated with a horizontal key comprising n elements, each in the set of complex numbers. That is, the horizontal key res1 which is associated with image-space x-coordinate $p_x$ comprises (in a preferred embodiment) n complex numbers, $res1_i$ for i in the range 1 to n, where $res1_i$ is:

$$res1_i = \sum_{z=1}^{L_i} e^{j2\pi k y_{i,z} p_x} * \langle a_{i,z}, b_{i,z} \rangle \qquad (1)$$

where $\langle a_{i,z}, b_{i,z} \rangle$ is the value $\langle a, b \rangle$ corresponding to k-space sample point $(kx_i, ky_{i,z})$, and where j represents $j^2=-1$, and where * represents complex-number multiplication.

In a preferred embodiment of the invention, the computation of the horizontal key or keys is easily parallelized, such as on CPU cores or on parallel electronic circuits such as GPUs, FPGAs, or ASICs.

Each horizontal key then yields efficient computation of the complex-number "colors" (or image/audio/video domain data, in general) at an arbitrary set of image-space y-coordinates in the image-space column $x=p_x$ associated with that horizontal key. Specifically, the complex-numbered color (or general data) at an arbitrary image-space coordinate $(p_x, p_y)$ can be computed, in a preferred embodiment, as:

$$\sum_{i=1}^{n} e^{j2\pi p_y kx_i} * res1_i \qquad (2)$$

In a preferred embodiment of the invention, the computation of the colors in an image-space column $x=p_x$ is easily parallelized, such as on CPU cores or on parallel electronic circuits such as GPUs, FPGAs, or ASICs.

For true 3-dimensional (3D) or N-dimensional (multi-dimensional) frequency-space data sets, it is known in the art that in such cases, 2D slices are processed with multiple 2D FFTs (such as in the x-y plane), in conjunction with 1D FFTs performed along each of the perpendicular axes (such as the z-axis). Or, equivalently, only 1D FFTs are applied, but are applied along all three coordinate axes. In the present case, a 1D HRGB (for example, ignoring the y-axes terms in the preferred 2D HRGB embodiment, by setting the $k_y$ and y terms to 0, as appropriate) can optionally act in place of the 1D FFT. (In the case of non-uniform data in the z-axes direction, the HRGB can in particular be used.) In brief, according to an embodiment of the invention, for an exemplary true 3D MRI scan with scan size 256×256×72 (in the x-y-z coordinate scan axes), the HRGB method can be applied to each of the seventy-two 256×256 x-y slices, either before or after multiple 1D FFTs (or 1D HRGBs) along the z-axes. As in the FFT-related art, the z-axes processing can occur either prior to or after the seventy-two 2D slices are processed.

Note that the term "image-space" in this (true 3D) context is defined somewhat loosely, since if the 2D slices are processed prior to the z-axes 1D FFT or HRGB applications, rather than after, the resulting colors are not technically the final colors of the final image, but rather are intermediate colors that only take their final form after the z-axes FFTs (or HRGBs) are performed. As such, the term "image-space" will herein be used to also refer to the space of such intermediate colors. That is, the art typically uses the terms "frequency-space" and "image-space", and so this terminology will be used herein, including in the context of an intermediate image-space with such intermediate color data.

Furthermore, in an embodiment of the invention, the complex-numbered colors can be displayed on display devices in multiple possible ways as is known in the art, such as by replacing each complex-number color by its real-number part, or by its magnitude, or by its phase, etc.

Note that the HRGB method is also seamlessly compatible with k-space pre-processing techniques (such as MRI GRAPPA), as well as with image post-processing techniques (such as MRI SENSE, off-resonance correction, etc.) The HRGB method replaces the k-space (frequency-space) to image-space conversion step, after pre-processing or prior to post-processing.

In brief, what happens to the frequency-space (or image/audio/video-space) sample points before the HRGB method is applied (or during)—such as GRAPPA or ground penetrating radar pre-processing—or what happens to the image/audio/video-space or intermediate image/audio/video-space data (or frequency-space data) after the HRGB method is applied (or during)—such as SENSE processing, MRI off-resonance correction, or 3D processing—has no bearing on the fact that the HRGB method was applied to one or more slices or subsets of frequency-space (or image/audio/video-space) data, and thus such scenarios are considered within the spirit and scope of the present invention, since the method comprises the specified method steps.

BRIEF DESCRIPTION OF THE SEVERAL VIEWS OF THE DRAWINGS

Exemplary embodiments of the present invention are illustrated by way of example in the accompanying drawings, in which like reference numbers indicate the same or similar elements, additionally in which the leftmost digit of a reference number identifies the drawing in which the reference number first appears, and in which.

DETAILED DESCRIPTION OF THE INVENTION

1. Terminology and Definitions, Part 1

The technical terminology associated with frequency-space and image/audio/video-space (inverse frequency-space, in general) is complicated by the fact that some aspects have numerous terms, while other aspects have few terms.

As such, it should be noted that, in the art, the time-frequency domain and spatial-frequency domain are computationally identical, as are the time domain and the spatial domain, differing in name only to distinguish the context of the data represented, such as audio data, general signal data, image data, etc. Furthermore, frequency-space (FS) is also referred to in the art as Fourier space, the frequency-domain, or k-space, among other terms. Without loss of generality, and for ease of notation and terminology, discussion and examples herein will often focus on the spatial-frequency domain and spatial domain in particular, and will often refer to "frequency-space" and "image-space" or "image/audio/video-space" in particular, but it should be understood that, in the art, various sets of related spaces are computationally identical, and differ only in name.

The terms "image/audio/video-space" and "image-space" are often used herein in place of what might be more accurately termed "inverse frequency-space" (IFS). Since this latter term is not used in the art, it would cause confusion. As such, the term "image-space" or "image/audio/video-space" (as in the title of the present invention) will often be used to refer to IFS, not necessarily to image data or audio data or video data specifically. That is, the terms "image" and "image/audio/video" are often used for lack of a better word, and are not intended to strictly limit the scope of the present invention.

In brief, and more accurately, the present invention discloses a parallelizable and high-resolution method and system for transforming FS data to IFS data, and transforming IFS data to FS data.

Data "reconstruction" is the term typically used in the art to refer to the process of transforming FS data to IFS data (image, audio, video, etc.). The term data "deconstruction" will be used herein to refer to the transformation of IFS data to FS data. Since the term "deconstruction" is not used in the art, the term data "processing" may herein sometimes be used in its place (such as in the Abstract). Of course, the term data "processing" must also refer to general processing or manipulation of data, although care is taken to ensure that there is no confusion, based on context. In general, when the term "processing" is used in conjunction with the word "reconstruction," such as in the Abstract, it is intended as "IFS-to-FS deconstruction."

2. Terminology and Definitions, Part 2

The term "region scaling factors" will be used herein to refer to multiplication factors that, in preferred embodiments of the present invention, make the computations more efficient. The region scaling factors change the bounding regions of the data in FS and in IFS.

It should be noted that, as is common in the art, discussion will assume without loss of generality that the FS and IFS data are located in square or rectangular regions centered around the origin in FS and in IFS. But, as is known in the art, FS and IFS are arranged in a tiled pattern (and FS is, in theory but not always in practice, mirrored across the origin), where the square or rectangular region around the origin is duplicated in adjacent squares and rectangles throughout FS and IFS. (For this reason, some common image compression techniques assume that FS and IFS are each in the range 0 up to $N_s$, whereas other techniques assume that they are in the range $-N_s/2$ up to $+N_s/2$, where $N_s$ is typically the number of pixels in a particular dimension.) Therefore, the discussion herein will assume, without loss of generality, that the FS and IFS data is centered about the origin. It is to be understood that implementing the present invention by shifting the region of analysis to another equivalent region, or regions, of FS and/or IFS, is considered within the scope of the present invention.

The term "pre-processing" will be used herein to refer to data processing techniques that alter the inputted data set of interest, before (and/or during) the implementation of the method. For example, in GRAPPA MRI imaging, a reduced set of k-space (frequency-space) data is collected by the MRI machine, then computational techniques are used to fill in the remainder of the k-space data set, and then this new, full data set is used for image reconstruction (FS to IFS transformation). It is also possible that such pre-processing of the machine data is applied after the start of the HRGB method, rather than before. The patent claims of the present invention are thus written to accommodate such embodiments and scenarios.

In brief, the steps of the HRGB method can be arranged in countless ways, and therefore it is intended that such arrangements are within the scope of the invention.

A critically important pre-processing technique is density compensation. This is necessary when, for example, the data is non-uniform (non-rectilinear, or non-Cartesian), such as in the case of spiral MRI imaging, and CT imaging in general. Density compensation typically refers to changing the data values of the data points, based on the proximity of other data points, so that the reconstructed (or deconstructed) data isn't corrupted by errors. In a preferred embodiment of the present invention, non-uniform data will be pre-processed by density compensation factors. But, this can occur either before, or during, the implementation of the HRGB method. Therefore, the patent claims are written to accommodate such embodiments and scenarios.

The term "post-processing" will be used herein to refer to data processing or manipulation techniques that alter the resulting data, after (and/or during) the method's data reconstruction or deconstruction. For example, in MRI SENSE imaging, the data is reconstructed (FS to IFS), but the resulting image is aliased, and therefore post-processing occurs, to un-alias the image, in order to obtain the final image.

Of course, some data manipulations can occur before and/or during the method, as well as after and/or during the method. Such processing is considered either pre-processing or post-processing, based on when it is applied.

In brief, extra data manipulation prior to (and/or during) the reconstruction or deconstruction, is referred to as "pre-processing", and extra data manipulation after (and/or during) the reconstruction or deconstruction is referred to as "post-processing".

The term "pre-conditioning" (and the related term "post-conditioning") is used herein to refer to any extra pre-processing (or post-processing) data manipulations that only superficially alter the data, prior to and/or during (or, after and/or during) the method's reconstruction or deconstruction. This includes, but is not limited to, rotating the coordinates in their space, transposing them, translating/shifting them, flipping them, scaling them, or skewing them. For example, in a preferred embodiment for MRI SENSE scans, where the number of $k_y$ values is considerably less than the number of $k_x$ values, the HRGB computations can be speeded up by transposing the FS data points (swapping their $k_x$ and $k_y$ values) prior to the reconstruction. Of course, the same result would occur if the data points were rotated 90 degrees clockwise, or 90 degrees counterclockwise, etc. The claims are written to accommodate such scenarios. In brief, it is intended that pre-conditioning (and post-conditioning, as well as pre-processing and post-processing) the data points is within the scope of the present invention, since it is an addition to the primary steps that comprise the present invention.

An important form of post-conditioning is transposition (swapping the x and y coordinates in IFS, or swapping the $k_x$ and $k_y$ coordinates in FS), since the HRGB method's outputted results are typically transposed. As such, the method's results will likely need to be transposed, or rotated, flipped, etc., to be properly oriented. It is intended that post-conditioning of the results is within the scope of the invention. In fact, transposition (a form of post-conditioning) is used in the preferred embodiment.

3. Terminology and Definitions, Part 3

The term "starting-space" and "target-space" will each refer to either FS or IFS, depending on what the starting or initial or inputted data set represents (FS data or IFS data), and what the resulting, transformed data set represents (FS data or IFS data). For example, for MRI/fMRI/CT image reconstruction, starting-space is FS, and target-space is IFS, whereas for image deconstruction (such as for data compression), starting-space is IFS, and target-space is FS. In a preferred embodiment, "starting-space" and "target-space" are different spaces, such as for transforming FS data to IFS data, or IFS data to FS data.

The term "color" is a generic term used, for ease, to refer to each of the resulting, complex-number data values calculated by the method. The terminology is borrowed from image reconstruction, but the term "color" is not intended as limiting the results to image data. Furthermore, even in the case of image data, the "color" may be an "intermediate color" rather than a final color, such as in the case of true 3D medical or industrial imaging, depending on when the z-axes FFTs or HRGBs are applied (either before, or after, the 2D slices are processed by the HRGB method).

The phrase "form final target-space data" refers to forming "target-space data" (coordinates and/or colors) that is final only in terms of current color-computation purposes, but not to imply that no more processing can be performed. For example, post-processing is possible, as well as using the data in conjunction with multi-dimensional data processing. The phrase "form final target-space data" is used, since the phrase "form target-space data" would cause confusion considering the fact that target-space data is technically formed, and typically pre-conditioned and adjusted, prior to that step.

In the claims, the term "or" is always intended as an inclusive "or" (A, or B, or A and B).

Further terms are defined in the present disclosure's description and specification sections.

In practice, the HRGB method and system will typically be applied to either a complete data set, such as for a single 2D slice of MRI or CT data or for each of a set of multiple 2D single slices, or will be applied to a subset of a larger data set, such as when true 3D or multi-dimensional frequency-space data is processed by multiple 2D HRGBs. In the patent claims, the raw starting-space data set is referred to as a "superset" rather than a set, so that for ease the data processed by the method can be referred to as a "set" of data rather than as a subset of data.

4. Terminology and Definitions, Part 4

The term "processing device" refers to any data-processing apparatus or system or computer capable of implementing an embodiment of the HRGB method specified herein. A processing device can be a general purpose computer or system that becomes a specific purpose computer or system when implementing an embodiment of the specified method. It can be a single apparatus, such as a general purpose computer, or it can comprise a plurality of component processing devices, including distributed or networked computers or systems. The processing device can comprise any suitable architecture consistent with implementing the method. In general, a processing device or data processing system is defined as an arrangement of a processor or processors in combination with either memory or peripherals, or both, performing data processing. (A peripheral is defined as a functional unit that transmits data to or receives data from a computer to which it is coupled, such as keyboards, monitors, printers, disk and tape drives, etc.)

The term "processor" refers to an apparatus or system, whether general purpose or customized to a specific purpose, whether local or distributed, capable of performing the computational steps of the specified method, and is defined in general as a functional unit that interprets and executes instruction data. Examples include but are not limited to: a single CPU with single or multiple cores, a plurality of CPUs each with either single or multiple cores, one or more GPU/GPGPUs, one or more FPGAs, one or more ASICs, or any combination of such elements. In a preferred embodiment, a combination of such processing elements will be used to implement the specified method. The term "processor" is used to refer to any such combinations.

It is to be understood that the present invention can be implemented in various forms of hardware, software, firmware, special purpose processes, or a combination thereof.

The term "memory" or "computer memory" refers to a functional unit to which data can be stored and from which data can be retrieved. Examples include random-access memory (RAM), read-only memory (ROM), etc. In a preferred embodiment, the HRGB system's "memory" will comprise multiple types of memory or computer memory, such as computer RAM, CPU registers, GPU global DRAM, GPU shared RAM, etc.

The term "display device" refers to an apparatus or system capable of displaying the method's computed colors, whether they then be in numerical form, alphanumerical form, binary form, graphical or visual form, or etc. Examples include printers, computer monitors, display screens, projectors, etc.

The term "storage device" refers to an apparatus or system capable of temporary or permanent storage of color information computed by the HRGB system or method. Examples include hard drives, compact discs, physical or digital film, RAM memory, ROM memory, etc.

The term "output device" refers to an apparatus or system capable of acquiring color information computed by the HRGB system or method. Examples include display devices, storage devices, and also computers or processors.

The term "PEC" or "parallel electronic circuit" refers to an apparatus or system capable of sequential and/or parallel computation. Examples include GPU/GPGPUs, FPGAs, ASICs, custom-designed electronic circuits or firmware, etc. It may be local, distributed, physically located within a computer or processing device, or physically located outside of a computer or processing device (and in high-performance applications likely will be).

The terms "input interface" and "output interface" are defined as in the art. In general, an "input interface" is any combination of means, such as electronic or graphical, by which a processor or processing device are connected to an input device (such as a keyboard, disk drive, or general data source) so that data can be transferred to the processor or processing device. In general, an "output interface" is any combination of means, such as electronic or graphical, by which a processor or processing device are connected to an output device (such as a disk drive, computer monitor, or printer) so that data can be transferred from the processor or processing device to the output device. The arrows in FIG. 3 that are associated with the input interface and the output interface are intended to represent the general direction of data flow, and for ease do not represent the two-way communication that is typically necessary with processors, input interfaces, output interfaces, input devices, and output devices.

5. Terminology and Definitions, Part 5

Although the terms "image" and "image-space" are often used for discussion purposes and exemplary embodiments, it should be noted that the intent is not to limit the present invention to such embodiments. Due to computational equivalence, the techniques apply equally to "audio" and "audio-space", "video" and "video-space", and all "inverse frequency-spaces" in general.

When the term "image" is used, it refers to literal images and image data, as well as IFS data in general (due to computational equivalence). It is defined similarly to that in U.S. application Ser. No. 13/778,446. That is, as used herein, the term "image" refers to multi-dimensional data composed of discrete—or continuous—image elements. The image may be, for example, a medical image of a subject collected by computer tomography, magnetic resonance imaging, ultrasound, or any other medical imaging system known to one of skill in the art. The image may also be associated with non-medical contexts, such as, for example, remote sensing systems, electron microscopy, etc. The method of the invention can be applied to images of any dimension, e.g. a 2-dimensional picture or a 3-dimensional volume. For a 2- or 3-dimensional image, the domain of the image is typically a 2- or 3-dimensional rectangular region, wherein each pixel or voxel can be addressed with reference to a set of 2 or 3 mutually orthogonal axes.

6. Additional Comments

The HRGB method is designed to be highly parallelizable. Of course, implementing the method sequentially, rather than in parallel, is within the scope of the invention.

Replacing the HRGB preferred embodiments with multiple 1D HRGBs, to process 2D or multi-dimensional data, is within the scope of the invention.

The term "PEC (parallel electronic circuit)" is used in association with a preferred embodiment of the HRGB system. An electronic circuit that performs the HRGB method sequentially, including in association with other such circuits, is within the scope of the invention.

In implementations of the HRGB system, the term "PEC" also refers to PEC embodiments that perform in like ways similar to GPUs/FPGAs/ASICs, but which are not necessarily add-ons or plug-ins, including such embodiments as computers, processing devices in general, distributed computers or processing devices, networked computers or processing devices, etc. (In high-performance applications, the PEC likely will be composed of distributed computers or components, or similar such systems.)

The coordinate axes are referred to as x, y, z, w, etc., for notational purposes and without loss of generality. For example, MRI scans can use arbitrary and oblique coordinate axes. Such cases are therefore within the scope of the invention.

In a preferred embodiment, the HRGB method uses the n unique $k_x$ values in the acquired data set. Using fewer data items, or extra data items, is considered within the scope of the invention. In particular, especially in cases when optional $k_x$ truncation is implemented, using non-unique $k_x$ values is within the scope of the invention. Similarly, using non-unique $k_y$ values, including when there are multiple same ($k_x$, $k_y$)

coordinates in the data set, is within the scope of the invention, and is in fact preferred in certain cases.

Shifting the phase of the numerical elements on which computation is based, such as using −j rather than j in EQS. (1)-(10), or similar such alterations, is within the scope of the invention.

The 1-dimensional raw data sets (such as audio, general signal data, 1D frequency-space data, etc.) are processed as a reduced case of the 2D HRGB. That is, the 2D HRGB's $k_y$ and y values, or $k_x$ and x values, as appropriate based on context, are set to 0. Interpolation in the starting-space data set is a preferred embodiment, particularly in the case of discrete data samples. The target-space data is then computed with arbitrarily-high resolution, as usual.

Typically, video data is treated as either adjacent and independent slices of 2D image data (such as for standard MRI scans), or as 3D data (where the x-y-z spatial coordinates are now x-y-t spatial and time coordinates, which are in general computationally identical but differ only in name). Similarly, some medical and industrial data are considered multi-dimensional, such for 3D medical scans that are taken at multiple times, in which case the data is arranged as x-y-z-t coordinates.

It should be noted that the HRGB method's computed results are typically transposed. Therefore, when the starting-space scan sizes or pixel sizes $N_x$ and $N_y$ are different (such as rectangular regions rather than the common square regions), the target-space's coordinates $p_x$ and $p_y$ are similarly transposed, and in a preferred embodiment, should be chosen as such when computing the reconstruction or deconstruction. For example, if the starting-space data is in a (Fourier-defined) bounding region with a 5:6 ratio of height (y direction) to width (x direction), then the target-space coordinates $p_x$ and $p_y$ would typically be selected with a 6:5 ratio. This is in the preferred embodiment, since the method allows arbitrary data point selections, so it is possible to take a non-preferred range or ratio, which might for example result in tiling of the image.

It should also be noted that, when processing discrete data, such as standard image data, the range of target-space coordinates $p_x$ and $p_y$ might be translated/shifted slightly from the origin, and appropriate adjustments should be made in the selection of $p_x$ and $p_y$.

It should also be noted that altering the method so that the outputted results are or aren't transposed (x and y coordinates swapped), is considered within the scope of the invention.

7. Discussion of the System and Method, Part 1

Exemplary embodiments of the HRGB system and the HRGB method will now be discussed.

For implementing the HRGB method and the HRGB system, there are two preferred approaches: Option 1, which is a software solution characterized by software running on a CPU-based computer system, preferably with multiple CPU cores so that the HRGB method's parallelized design can be used; and Option 2, which is a scalable hardware/circuit solution for extensive parallelization, characterized by parallel electronic circuits such as a GPU/GPGPU, FPGA, or ASIC. (Of course, customized or dedicated computer or processing systems would offer the greatest speed and parallelization, but the financial costs of this third preferred approach would likely cause it to be less popular in practice at the present time.)

In the first such preferred approach or embodiment, Option 1, applied to MRI/fMRI, CT, ultrasound, or other frequency-space based problems, exemplary workflow is as follows. Without loss of generality, discussion will focus on MRI/fMRI workflow in particular. The MRI/fMRI machine collects and outputs raw frequency-space (k-space) samples in analog format; an analog-to-digital converter changes the samples to digital form; the digital samples are inputted into a computer; the HRGB method is applied to the data; the HRGB method or system computes the resulting image; the computer saves the image to a local disk, and optionally saves the raw k-space samples to a local disk.

In the second preferred approach or embodiment, Option 2, the computer system uses a scalable hardware/circuit solution, for extensive parallelization. If a user prefers real-time image generation, or extremely-large images for better clarity and diagnosis, Option 2 offers scalable hardware/circuit solutions, for arbitrary levels of parallelization.

Since the HRGB method has many independent calculations, they lend themselves to highly parallel implementations. Although modern computers can certainly offer multi-core parallelization of software (Option 1), hardware/circuit solutions offer arbitrary levels of parallelization, limited only by cost. For scalable hardware/circuit parallelization, users have various cost-effective options: GPUs, FPGAs, and ASICs. The GPU option is cost-effective, while also offering the ease of software. It involves API interfaces to routines executed on off-the-shelf GPU or GPGPU cards. Current GPUs/GPGPUs can compute several trillion floating-point operations per second.

The FPGAs and ASICs options offer the highest levels of parallelization. In these embodiments, the developer can interface the computer with a card or external circuit containing a custom-programmed FPGA or custom-built ASIC.

New generation communication solutions such as PCI Express, USB 3.0, and 10 Gigabit Ethernet, are already so commonplace that, for example, some companies offer complete solutions for field-programmable gate arrays (FPGA). For example, since typical MRI raw data samples would occupy approximately a couple megabytes, a highly-parallelized external option could reduce calculation time on a scale measured in orders of magnitude. The current fast communication protocols can transfer such data in a negligible amount of time.

The design flexibility inherent in FPGAs means that a number of potential memory models, architectures, and/or access schemes could be employed. For example, ready solutions are provided by some companies for implementing dual-access RAM. Alternatives such as echoing data to multiple SRAM locations could eliminate typical speed bottlenecks associated with massively parallel computations.

Indeed, parallel RAM architectures are topics of current computer science and engineering research, and there will be more options developed by many people, so there are really no limits to the specific memory architecture.

In summary, there are so many ways to implement the HRGB method and system as parallel hardware/circuitry, that it becomes impossible to address all possible architectures. So, exemplary and preferred embodiments will be discussed.

An exemplary HRGB workflow is as follows. An MRI/fMRI machine collects then outputs raw samples in analog format; an analog-to-digital converter changes the data to digital data; the samples, now in digital form, are transferred to (inputted into) the computer. For faster processing, the incoming samples can be sorted into numerical sequence (for example, sort by $k_x$); this sorting can be accomplished on the computer (CPU), or preferably in parallel on the GPU, FPGA, or ASIC. Next, modern communication protocols, such as PCI Express, USB 3.0, 10 Gigabit Ethernet, etc., are fast enough to make the computer-to-GPU/FPGA/ASIC transmission step negligible. Next, each GPU/FPGA/ASIC receives the full data set (or else uses concurrent RAM access to obtain it from a single source, as determined by the parallel RAM architecture chosen by the developer). Next, each functional block in the GPUs/FPGAs/ASICs computes one arbitrarily-sized section of the final image, using the computational steps of the HRGB method.

In practice, for a 512×512 pixel image, an FPGA could contain (for example) 256 or 512 functional blocks, each capable of at least single-cycle integer multiplications and additions. This functionality can be extended arbitrarily. For example, if the user wants to compute 2,000×2,000 pixel images (current machines typically output images of size up to only 256×256 pixels), and the user's system has programmed an FPGA with 100 functional blocks, then each block can take the task of computing a small, 200×200 (or etc.) pixel subimage of the complete image. If the user wants a typical 256×256 pixel image, on an FPGA with 100 functional blocks, then each block can compute a small, 25×25 (or etc.) pixel subimage.

Next, each GPU/FPGA/ASIC transmits its subimage results back to the main computer, then the main computer quickly assembles the subimages into the complete image. Or, alternatively, the GPUs/FPGAs/ASICs can combine the subimage results in the GPU/FPGA/ASIC global RAM, then transmit the complete image to the main computer.

8. Discussion of the System and Method, Part 2

The HRGB method and system will now be discussed in detail, in terms of frequency-space to image-space conversions, due to the relevance to medical imaging. However, for general data processing, the HRGB method can equivalently be performed in reverse, to go from image-space sample points (preferably interpolated) to frequency-space sample points, which is a goal of many image compression techniques.

(That is, the HRGB method can also be applied to image/audio/video-space data, rather than frequency-space data, and the result is then frequency-space data, rather than image/audio/video-space data. The HRGB method works in either direction, with no modifications. But for discussion purposes, and without loss of generality, the following discussion will focus on image reconstruction in particular, which is frequency-space data transformed to image-space data.)

Start with a given set of frequency-space sample points (typically, 2-dimensional or N-dimensional coordinates each in the set of real numbers, and typically representing spatial frequencies, or time frequencies, or in the case of MRI medical imaging, spatial frequencies known as k-space frequencies) and their associated values (typically, values are each in the set of complex numbers, each of the form a+i b). That is, each frequency-space sample point will typically consist of a set of numbers $\{k_1, k_2, \ldots, k_N; a, b\}$, which in the case of MRI imaging is a set of numbers $\{k_x, k_y; a, b\}$ representing a k-space frequency coordinate ($k_x$, $k_y$), and its associated value, a+i b. In an MRI machine, the machine obtains this k-space information, then converts it to a digital stream of information, which is then transferred to the MRI computer, which is responsible for computing a medical image based on the k-space information.

For the HRGB preferred-mode process, the MRI computer (or general computer, for non-MRI images, or for general data processing) can opt to convert the k-space information (or, in general, the frequency-space information) into an image by using software-only techniques (optionally using parallel threading, to increase speed of computation), or for much faster results, can opt to transfer the k-space information (in raw form, or in pre-processed form to facilitate the upcoming steps) to a parallel-computing electronic circuit—such as a custom-built ASIC integrated circuit, or a custom FPGA electronic circuit, or an off-the-shelf GPU or GPGPU.

For MRI imaging in particular, the parallel electronic circuit (ASIC, FPGA, GPU, etc.) will receive a list of items which are each of the form $\{k_x, k_y; a, b\}$. This list can be transferred as-is to the parallel electronic circuit (PEC), or for greater efficiency can be pre-sorted or pre-processed (e.g., compressed, etc.) prior to the transfer to the PEC.

MRI machines generate Fourier-based frequency information, which means that the k-space sample points ($k_x$, $k_y$) are located in a rectangular region in the range $-f_{x,max} \leq k_x < +f_{x,max}$, and $-f_{y,max} \leq k_y < +f_{y,max}$, according to the rules of Fourier space. In image-space, this translates to a set of (x, y) coordinates in the range $-X_{max} \leq x < +X_{max}$, and $-Y_{max} \leq y < +Y_{max}$, according to the rules of Fourier space. However, for efficiency and without loss of generality, it will be assumed in the following discussion that the k-space coordinates ($k_x$, $k_y$) are all multiplied by a scaling factor 8/max, so that all k-space coordinates ($k_x$, $k_y$) are now in the range $-8 \leq k_x < +8$, and $-8 \leq k_y < +8$, which then converts, by the rules of Fourier space, into an image which is in the coordinate range $-8 \leq x < +8$, and $-8 \leq y < +8$, in image-space. (The resulting image is the same either with or without this scaling factor, but the scaling factor makes the following steps more efficient.)

The PEC can now arrange the frequency-space (k-space) data, as follows. It computes (or receives from the main computer) a list of all unique $k_x$ values, along with each $k_x$ value's list of associated $k_y$ values. (For greater computational speed, the $k_x$ values can be truncated or rounded to a chosen number of decimal places, which will reduce the number of unique $k_x$ values, thereby reducing the number of computational steps.) Therefore, each unique $k_x$ is associated with a list of associated $k_y$ values, as per the original k-space data set.

For example, if the frequency-space data set consists of the data items $\{5,6; 1,1\}$, $\{5,11; 1,1\}$, $\{5,12; 1,1\}$, $\{10,11; 1,1\}$, and $\{10,20; 1,1\}$, then in that case there are n=2 unique $k_x$ values: $kx_1$=5, and $kx_2$=10. Further, $kx_1$=5 is associated with (herein also referred to as "paired with") a set of 3 ($L_1$=3) $k_y$ values: $ky_{1,1}$=6, $ky_{1,2}$=11, and $ky_{1,3}$=12. Similarly, $kx_2$=10 is associated with (paired with) a set of 2 ($L_2$=2) $k_y$ values: $ky_{2,1}$=11, and $ky_{2,2}$=20.

In brief, there are n unique $k_x$ values, notated $kx_i$ for i in the range 1 to n. A data item $kx_i$ is associated with (paired with) a set of $L_i$ $k_y$ values (not necessarily unique, but in practice typically will be), which are notated $ky_{i,1}$, $ky_{i,2}$, ..., $ky_{i,L_i}$. That is, the element $kx_i$ is associated with (paired with) a set of values $ky_{i,z}$, where z ranges from 1 to $L_i$.

The user may choose which image points in image-space he or she wants to compute, when generating the associated image or MRI image. Typically, the user will choose a set of image-space points (x, y) in the range $-X_{max} \leq x < +X_{max}$, and $-Y_{max} \leq y < +Y_{max}$, or in the simplified scaled case, $-8 \leq x < +8$, and $-8 \leq y < +8$. Typically, the user will choose a rectilinear set of image-space coordinates (x, y) to compute, with as many or as few image-space coordinates as per the user's fully-arbitrary choice for the resulting image's size. (For example, the user may choose a rectilinear grid of image-space coordinates measuring 2000 points by 2000 points, which will then yield an output image of size 2000×2000 pixels, rather than the typical MRI image of size 256×256 pixels.)

For each unique x coordinate chosen in image-space (that is, each unique column in image-space), the PEC (PEC in a preferred embodiment) will compute that image-space column's "horizontal key", as follows. Assume that the current image-space column has coordinate $x=p_x$. (For example, the range for $p_x$ might be something like 1024 values ranging from −8 to +8, resulting in an image of size 1024×1024 pixels.) Also, due to parallelization, the image's "horizontal keys", one for each column value $p_x$, can be computed in parallel, on the PEC.

For each chosen value of $p_x$, compute an n-element structure res1, which will be referred to as the "horizontal key" for image-space column $p_x$. The horizontal key res1 comprises n elements (in a preferred embodiment), where as before, n is the number of unique $k_x$ values in the frequency-space data set. Therefore, the elements of res1 can be notated $res1_i$ for i in the range 1 to n.

Each term, $res1_i$, is computed as: $res1_i$ is equal to the sum of these (complex-valued) terms:

$$<\cos(2\pi ky_{i,z}p_x), \sin(2\pi ky_{i,z}p_x)>*<a_{i,z},b_{i,z}> \quad (3)$$

where * represents complex-number multiplication, and where z ranges through all of the $L_i$ subscripts z for the elements $ky_{i,z}$ "paired with" $kx_i$, and where $<a_{i,z}, b_{i,z}>$ is the value $<a, b>$ corresponding to k-space sample point ($kx_i$, $ky_{i,z}$). The notation $<a, b>$ will be used to represent the complex number a+j b, where $j^2=-1$.

(The n elements $res1_i$ are each independent, and therefore the computation of the elements $res1_i$ can be fully parallelized, in a preferred embodiment.)

When the "horizontal key" for an image-space column $p_x$ has been computed, it is now possible to efficiently compute the "colors" for each of that column's chosen image points. Specifically, compute (in parallel, typically on the PEC, in a preferred embodiment) the "colors" of the image points in that image-space column, $p_x$, as follows. For each y coordinate, $p_y$, in the set of chosen image points in the current column $p_x$ (for example, $p_y$ ranging from −8 to +8 in increments of 1/1024), perform the following calculations. Compute an n-element structure res2, where res2 comprises n elements (in a preferred embodiment), notated $res2_i$ for i in the range 1 to n. Each term, $res2_i$, is computed as:

$$res2_i=<\cos(2\pi p_y kx_i), \sin(2\pi p_y kx_i)>*(res1_i) \quad (4)$$

where * represents complex-number multiplication. The sum of the complex-number terms $res2_i$ in res2, is the complex-number "color" at point ($p_x$, $p_y$) in image-space.

(The n elements $res2_i$ are each independent, and therefore the computation of the elements $res2_i$ can be fully parallelized, in a preferred embodiment.)

(Note that computing the sum of a set of terms can in general be parallelized, including in this case, and in a preferred embodiment.)

As with traditional MRI imaging, the complex-valued "color" values can be converted to real-valued colors by taking the magnitude of the color, or the real component only, or the phase of the complex-valued color, etc. Whichever way is chosen, it will fit seamlessly with current MRI work flows, since the same color conversion steps can now be performed here. The difference is that, now, the colors correspond to a faster, more accurate, arbitrarily-large image. (Note: the HRGB process is also seamlessly compatible with k-space pre-processing techniques (such as GRAPPA), as well as with image post-processing techniques (such as SENSE, off-resonance correction, etc.) In such cases, the HRGB process replaces the k-space to image-space conversion step, after pre-processing or prior to post-processing.)

The resulting image "colors" will typically fall outside the 0-255 range of a typical grayscale computer image. This is a positive feature, since it will allow the resulting image to have a large dynamic range, which can then be reduced to a smaller range in whichever way the user prefers—for example, by color-coding the large dynamic range, or scaling to a smaller 0-255 range, or scaling to a 0-65535 range, etc.

The user will typically choose image-space points that range across the entire image zone, $-8 \le x < +8$, and $-8 \le y < +8$ (or more generally, $-X_{max} \le x < +X_{max}$, and $-Y_{max} \le y < +Y_{max}$). But, the user can alternatively use the computing resources to "zoom in" on a small subset of the full image-space range, such as to take a closer look at a small region of interest, such as a potential malignancy. In this case, the user may, for example, choose a set of 2000×2000 image-space points, all limited to a small subset of the full image-space range.

The image points' colors that are computed in the previous steps can either be transferred to the main computer immediately, or can be collected on the PEC and then transferred quickly and efficiently in a single batch transfer, when all of the image points' color computations are complete.

For efficiency, since the amount of computation will depend on the number of unique $k_x$ values, the user may notice that in certain cases, the number of unique $k_y$ values is actually less than the number of unique $k_x$ values (such as with parallel-coil SENSE MRI imaging). In such cases, the k-space samples can be optionally rotated or flipped, so that the $k_x$ and $k_y$ values swap. This will then result in a smaller number of unique $k_x$ values, which will then improve the speed of computation. Of course, the resulting image will similarly be swapped or flipped, which means that the image can be transformed in the opposite way, so that it will be oriented properly. Equivalently, for no swapping or flipping, the HRGB steps for computing color can be altered so that, rather than computing "horizontal keys", which are then multiplied or processed by the $p_y$ values, the PEC (or processor, in general) can alternatively compute "vertical keys", which are then multiplied or processed by the $p_x$ values. Such transpositions are intended as within the scope of the present invention, since they are simply a swap, exchange, or change of coordinates with respect to the present invention.

For non-rectilinear or non-uniform scans (such as CT, spiral or radial MRI, etc.), k-space pre-processing includes common techniques as weighting the k-space values by density-compensation functions, prior to the conversion from k-space to image-space. The HRGB process integrates seamlessly with pre-processing or post-processing, since all pre-processing or post-processing techniques will not affect the HRGB's conversion of data between k-space (frequency-space) and image-space (inverse frequency-space, in general).

9. Discussion of the System and Method, Part 3

For the purpose of drafting the patent claims, to encompass the preferred and many non-preferred embodiments, further discussion is necessary. EQS. (1)-(4) represent preferred embodiments, which yield computational efficiency due to the pre-application of region scaling factors to the FS or IFS data. The equations will now be generalized, such as for cases in which region scaling factors are not pre-applied to the starting data set, or in which non-preferred region scaling factors are applied to the data. Such cases are intended as within the scope of the present invention.

According to EQ. (3), res1i is equal to the sum of the terms $$<\cos(2\pi ky_{i,z}p_x), \sin(2\pi ky_{i,z}p_x)>*<a_{i,z},b_{i,z}>$$

where z ranges from 1 to $L_i$, and where $<a_{i,z}, b_{i,z}>$ is the data value $<a, b>$ corresponding to k-space sample point ($kx_i$, $ky_{i,z}$).

Rewriting that using common art-related notation, for which $e^{(j\,T)}$ is the preferred notation for $<\cos(T), \sin(T)>$, and rewriting using common summation notation, we get:

$$res1_i = \sum_{z=1}^{L_i} (e^{j2\pi k y_{i,z} p_x} * \langle a_{i,z}, b_{i,z} \rangle) \qquad (5)$$

According to EQ. (4), the structure res2 comprises n elements, $res2_i$ for i in the range 1 to n:

$$res2_i = <\cos(2\pi p_y k x_i), \sin(2\pi p_y k x_i)>*(res1_i)$$

where the sum of the terms $res2_i$ yields the "color" at point $(p_x, p_y)$ in image-space (or IFS, in general).

Rewriting that using $e^{(j\,T)}$ notation and summation notation, we get: the color at point $(p_x, p_y)$ in IFS is:

$$\sum_{i=1}^{n} (e^{j2\pi p_y k x_i} * res1_i) \qquad (6)$$

As was discussed, EQS. (1)-(4), and therefore EQS. (1)-(6), are based on FS data and IFS data that are pre-multiplied by region scaling factors, to align the data regions in FS and IFS. In a preferred embodiment, computational efficiency is obtained by applying region scaling factors to the FS data and IFS data, to align the data regions in FS and IFS. In a non-preferred embodiment, the data are not scaled, since according to the method the target-space data points are arbitrary, and thus the method can compensate for such a case by (for example) taking an appropriately-sized reconstruction or deconstruction region. Such cases are intended as within the scope of the present invention. Such non-preferred scenarios will now be discussed in more detail.

For ease, consider a 1D case, with a set of $k_x$ values in FS and a set of x values in IFS. The same rules will of course apply for higher-dimensional cases, such as with $k_y$ and y values, $k_z$ and z values, $k_w$ and w values, etc. As first explained in the summary section, the data regions in FS and IFS will align if the $k_x$ values are each multiplied by a factor $(\sqrt{N_x})/(2\,f_{x,max})$—call this $E_6$—and the x values are each multiplied by a factor $(\sqrt{N_x})/(2\,X_{max})$—call this $E_2$. Similarly, along the y-axes, $k_y$ values are each multiplied by a factor $(\sqrt{N_y})/(2f_{y,max})$—call this $E_1$—and y values are each multiplied by a factor $(\sqrt{N_y})/(2\,Y_{max})$—call this $E_5$.

In brief, the prior equations EQS. (1)-(6) are based on $ky_{i,z,pre\text{-}scaled}$, etc., which is equal to $E_1\,ky_{i,z,unscaled}$, etc. As such, the equations' $ky_{i,z,pre\text{-}scaled}$, etc., can be replaced by $E_1\,ky_{i,z,unscaled}$, etc. Therefore, if the FS and IFS data is not pre-scaled by region scaling factors for efficiency, the equations EQS. (5)-(6) are then, in a non-preferred embodiment:

$$res1_i = \sum_{z=1}^{L_i} (e^{j2\pi k y_{i,z} E_1 p_x E_2} * \langle a_{i,z}, b_{i,z} \rangle) \qquad (7)$$

$$\sum_{i=1}^{n} (e^{j2\pi p_y E_5 k x_i E_6} * res1_i) \qquad (8)$$

where, again, $E_1=(\sqrt{N_y})/(2f_{y,max})$, $E_2=(\sqrt{N_x})/(2\,X_{max})$, $E_5=(\sqrt{N_y})/(2\,Y_{max})$, and $E_6=(\sqrt{N_x})/(2\,f_{x,max})$.

These $E_1$ to $E_6$ factors are the optimal region scaling factors, which are pre-applied to the FS and IFS data for efficiency, in a preferred embodiment, but which also might be instead applied during the steps of the HRGB method, in a non-preferred embodiment. In another non-preferred scenario, the region scaling factors might be applied with arbitrary numbers, and then compensated for (for example) by canceling computationally to yield the preferred factors. In another exemplary scenario, non-preferred region scaling factors can be compensated for, by the use of a non-preferred arbitrarily-chosen target-space range of points—for example, causing the medical or industrial image to be smaller and/or surrounded by an unnecessarily large margin. All such non-preferred embodiments are intended as within the spirit and scope of the present invention. In brief, optimal region scaling factors were discussed, but non-preferred factors can be compensated for, such as computationally, or by the selection of non-preferred target-space regions, or etc. Therefore, EQS. (7)-(8) are the general forms of EQS. (5)-(6).

Furthermore, although the summation index range 1 to $L_i$, and 1 to n, are the preferred index ranges, it is intended as within the scope of the invention if embodiments use fewer terms, or more terms. In fact, if the goal is to increase computation speed at the expense of image quality or target-space data quality, then taking fewer terms in the sum is actually the preferred approach. As such, the optimal summation range 1 to $L_i$ will be generalized as $r_1$ to $r_2$, and the optimal summation range 1 to n will be generalized as $r_3$ to $r_4$. (It is intended that these ranges also encompass cases where the summation index is irregularly spaced, such as when taking an arbitrary subset of the summation terms.)

In conclusion, to try to encompass a large number of the countless non-preferred and preferred embodiments, EQS. (5)-(8) can be written generally as:

$$res1_i = \sum_{z=r_1}^{r_2} (e^{j2\pi k y_{i,z} E_1 p_x E_2} * \langle a_{i,z}, b_{i,z} \rangle) \qquad (9)$$

$$\sum_{i=r_3}^{r_4} (e^{j2\pi p_y E_5 k x_i E_6} * res1_i) \qquad (10)$$

10. Exemplary and Preferred Embodiments of the Method and System

Figure 1:
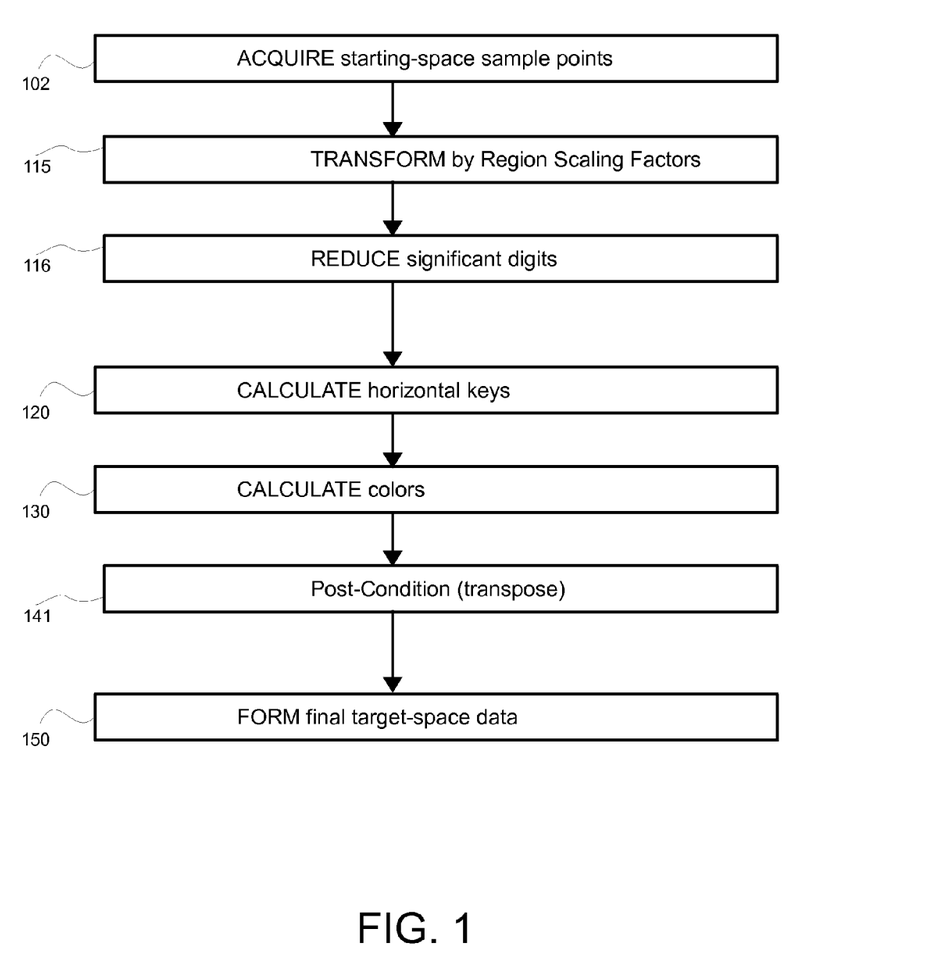
FIG. 1 is a flow sheet diagram of the HRGB method, according to an exemplary embodiment of the invention.
Figure 3:
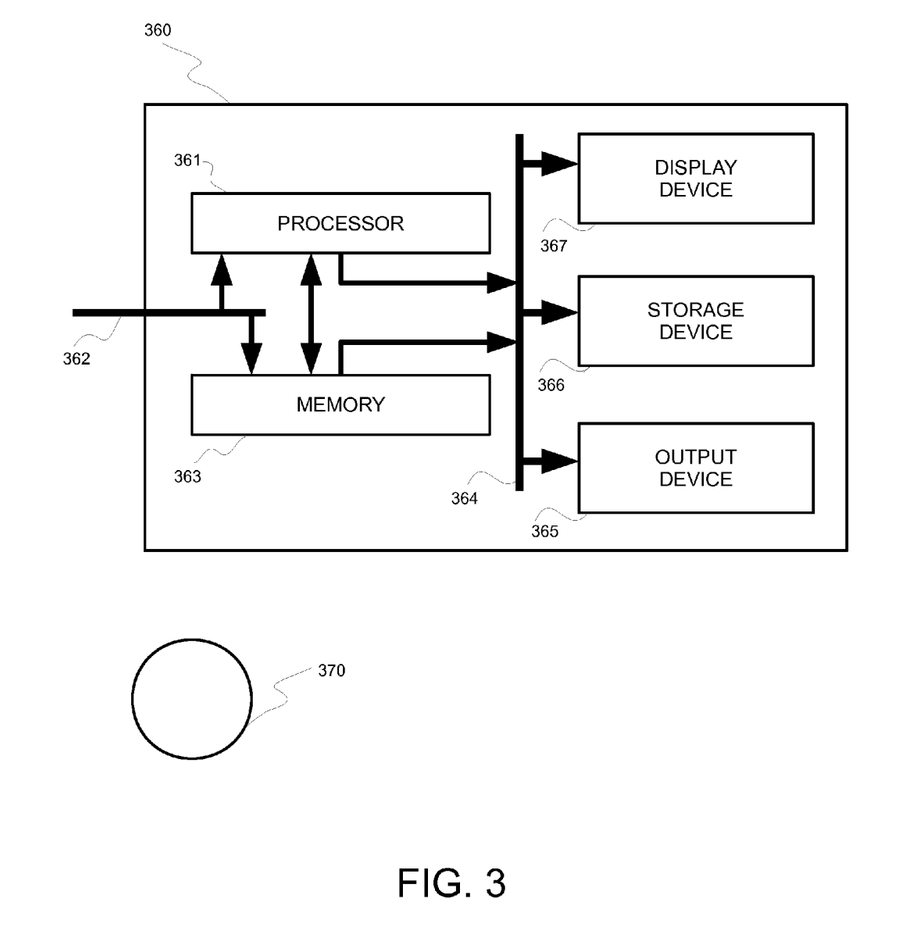
FIG. 3 is a block schematic diagram of a preferred HRGB system for implementing the HRGB method, according to an embodiment of the invention.

FIG. 1 illustrates an exemplary embodiment of the HRGB method, and FIG. 3 illustrates an exemplary and preferred embodiment of the HRGB system. A subset of optionally pre-processed and pre-conditioned N-dimensional frequency-space (or image/audio/video-space) data is acquired 102 by a processing device 360, the data is transformed 115 by region scaling factors, and the data is optionally reduced 116 in numerical significant digits. A "horizontal key" of elements is calculated 120 on a processor 361, preferably in parallel, for each of an arbitrary set of x-coordinates in image/audio/video-space (or frequency-space). Image/audio/video-space "color" data (or frequency-space data) are calculated 130 on a processor 361, preferably in parallel, at the x-coordinates corresponding to the horizontal keys. The spatial/time-domain coordinates (or the frequency-space coordinates) are arbitrary, and the reconstruction's calculated image/audio/video data (or the deconstruction's calculated frequency-space data) are optionally transposed 141 (such as for display purposes), and are thus formed 150 in a memory 363 or on an output device 365. The method can be applied to other subsets, such as in the N-dimensional case. The computer program instructions (such as machine language code, object code, assembly language code, pseudocode, or high-level language code) implementing the method, such as for a computer system, may be stored on a non-transitory computer-readable storage device 370.

Figure 2:
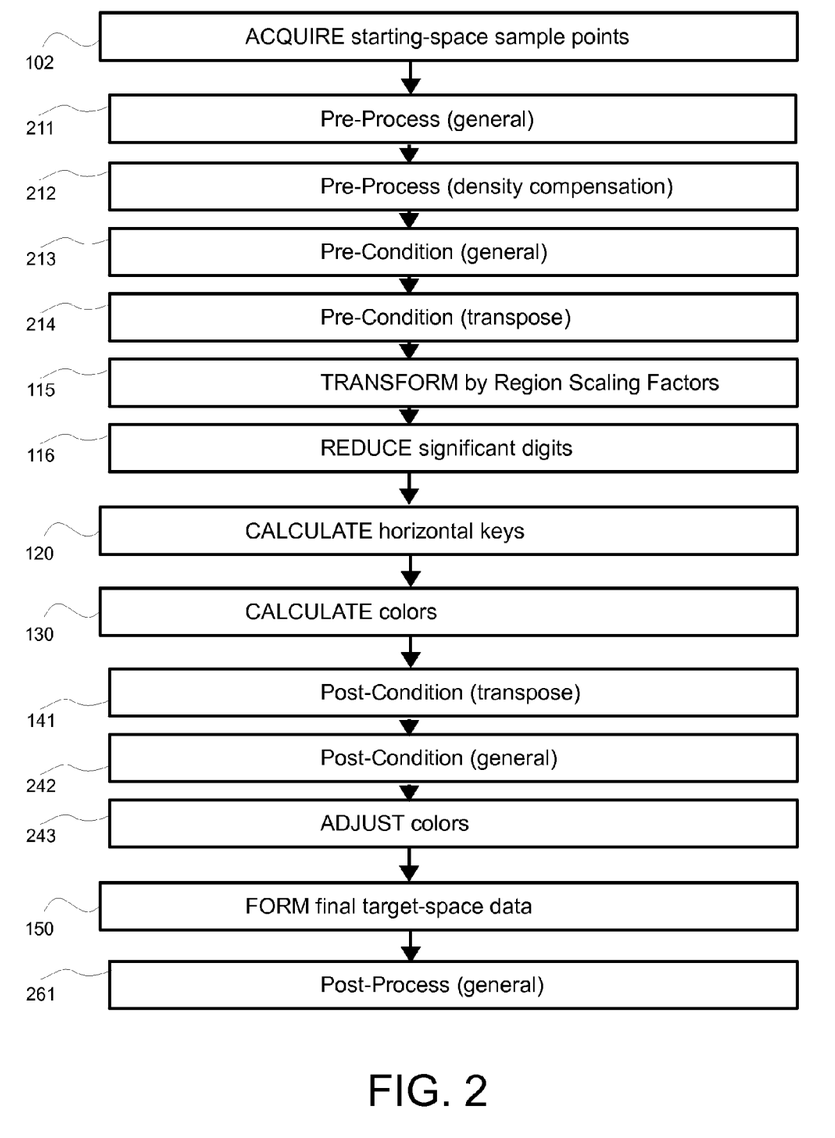
FIG. 2 is a flow sheet diagram of the HRGB method, according to another exemplary embodiment of the invention.

FIG. 2 illustrates another exemplary embodiment of the HRGB method. A medical, industrial, or scientific apparatus generates raw N-dimensional (1D, 2D, 3D, or multi-dimensional) FS or IFS data or equivalent such data (a superset comprising "N-dimensional starting-space sample points", wherein each such sample point comprises a set of associated "sample-point component numbers" which are notated without loss of generality as a, b, $k_x$, $k_y$, $k_3$, $k_4$, $k_5$, etc., wherein ($k_x$, $k_y$, $k_3$, $k_4$, $k_5$, ...) represents a "starting-space coordinate" and <a, b> represents a "starting-space data value" associated with that coordinate). Next, a "starting-space data set", such as a 2D subset of the superset, is acquired 102 by a processing device 360 (by way of an input interface 362), for computational processing by implementation of the method. Next, the data is optionally pre-processed 211, in the processing device 360, such as by art-specific techniques (such as GRAPPA k-space filling for MRI GRAPPA scans, seismic data pre-reconstruction pre-processing, etc.), and/or by density compensation factors 212. The data is then optionally pre-conditioned 213 in the processing device 360 (such as by transposing MRI SENSE data so that the number of unique $k_x$ values is reduced). Next, the data is optionally transposed 214 in the processing device 360 (such as for MRI SENSE data, or for rectangular image deconstruction so that the outputted results are oriented in the same height and width ratios as the raw data). Next, after the data has been pre-processed and pre-conditioned, the data is optionally transformed 115 by applying region scaling factors, for computational efficiency. Next, the data optionally has all $k_x$ values reduced 116 in their significant digits, such as to 3 decimal places (thousandths place). Next, a set of arbitrary target-space coordinates, each of the form ($p_x$, $p_y$), is chosen. For each chosen "target-space x-coordinate" $p_x$ value, a horizontal key is calculated 120 on the processor 361, and these horizontal keys (each comprising a set of "horizontal key elements", each such element notated $res1_i$, and computed based on the disclosed equations) are preferably computed in parallel. For each $p_x$ value, the set of arbitrary $p_y$ values in that column are then considered, and this is preferably done in parallel for each $p_y$, and similarly across all $p_x$'s, which is also done preferably in parallel. For each such ($p_x$, $p_y$) combination (wherein $p_x$ is a current "target-space x-coordinate" and $p_y$ is a current "target-space y-coordinate"), a color is calculated 130 (based on the disclosed equations) on the processor 361. The resulting target-space data is optionally transposed 141 and/or post-conditioned 242 (rotated, skewed, scaled, etc.), such as for correctly orienting the outputted data. Next, the complex-number color data is optionally adjusted 243, from complex numbers to real numbers or integers, such as when the target-space data is image data and is in its final form (for example, isn't intermediate data during multi-dimensional data processing, and is ready for display right after the adjustment), and needs to be adjusted to real or integer color data for the purpose of creating a standard-format image file such as a PNG or JPG image. The resulting data is now successfully formed 150 in the memory 363, and is therefore optionally displayed on a display device 367 such as a computer screen, or stored on a storage device 366 such as a disc, etc. Post-processing 261 is optionally applied to the data (such as for MRI SENSE processing, where the resulting image is combined with other images, in order to combine them into a single un-aliased image). Optionally, the post-processed data can be outputted to an output device 365 (such as an Internet server) by way of an output interface 364.

11. Additional Comments

It is to be understood that the above (and below) described embodiments are merely illustrative of numerous and varied other embodiments which may constitute applications of the principles of the present invention. Such other embodiments may be readily devised by those skilled in the art without departing from the spirit and scope of the invention and it is intended that they be deemed within the scope of the invention.

12. Additional Comments and Disclosures in the Present Application

The prior sections were identical to or essentially identical to the corresponding sections of the present application's priority document U.S. application Ser. No. 14/639,114.

The following sections include additional comments, and some additional new content disclosures, in the present CIP application. In the following sections, reference is made to the present CIP patent application's two priority documents, which are: U.S. application Ser. No. 14/639,114, and U.S. Provisional App. No. 61/947,737.

The '737 and '114 priority documents disclose using the HRGB method to process multi-media content generally. For example, the HRGB method allows arbitrarily-sized outputs, which is of course applicable to multi-media data. Furthermore, the HRGB method's pre-processing, post-processing, pre-conditioning, and post-conditioning steps can be used to implement multi-media effects, such as those FS and IFS adjustments known in the art, including smoothing, sharpening, rippling (such as Gibbs ringing), applying low-pass filters or high-pass filters or other such filters, adding or omitting data in the data sets, etc.

Since the HRGB method allows arbitrary input data, the inputted multi-media data can be pre-processed (pre-processing, which occurs prior to or during implementation of the HRGB method) to increase or decrease dynamic range, which can then increase or decrease contrast, which then allows the method's outputted data to reflect that pre-processing—for example, resulting in the increase or decrease of Fourier rippling (or Gibbs ringing) artifacts, such as in the context of multi-media graphical effects.

Since the HRGB method allows arbitrary inputs in starting-space and arbitrary outputs in target-space, multi-media or general data processing or compression applications are not limited to rectilinear data, in contrast to current FFT-based data compression techniques that deconstruct (or reconstruct) rectilinear data. For example, since the HRGB output's data points are arbitrary, an image can be deconstructed into radial, semi-radial, spiral, etc., frequency-space data, rather than rectilinear frequency-space data. This can offer different amounts of compression compared to rectilinear forms of compression.

Furthermore, the trigonometric functions in the '114 document's claims (and the present document's claims) can be replaced with different functions, including arbitrary functions, as was alluded to and referenced in the '737 and '114 priority documents. Also, as further discussed in the priority documents, the data sets can be limited to different subregions, such as 0 to 0.5, or etc., rather than the preferred FS or IFS ranges.

As discussed in the '737 and '114 priority documents, windowing functions such as those known in the art can be applied to the data.

Also, the technique of "zero-padding" data is well known in the related arts, particularly in the context of FS data, including when windowing is used to alter data.

It is noted here that in the present application and in the priority documents, the term "FFT" (Fast Fourier Transform) was used, as is sometimes done in art, to refer to the Fourier Transform or Fourier Transform techniques in general. The FFT is a particular computational speed-up implementation of the Discrete Fourier Transform, and is sometimes, for ease of discussion, used in the art synonymously with the DFT or FT, based on context. That is, since the FFT is the most common implementation of the DFT and FT, it is often used as a general term.

The '737 and '114 priority documents refer in detail to density-compensation functions and data weights, such as those known in the art. There are numerous density-compensation functions well known in the art, particularly those for radial and spiral data such as MRI/CT/PET/SPECT data. (It is noted here that "density-compensation functions" are often also (similarly or identically) known in the art as "density-compensation filters", and are sometimes applied to IFS data and deconstructions, not just to FS data and reconstructions.) In particular, some well-known and frequently-used density-compensation functions/filters known and used in the art, particularly for radial and spiral data, are: ramp filters, Voronoi weighting, modified ramp filters, apodized ramp filters, Hanning/Hann filters, Butterworth filters, ramp-Hanning filters, ramp-Hamming filters, Parzen filters, Hamming filters, Shepp-Logan filters, Cosine filters, square root of a ramp filter, etc.

Some well-known and frequently-used interpolation techniques, such as for back-projection approaches, include: nearest, linear, spline, cubic, etc. (It is noted here that the HRGB method does not require gridding or interpolation, but these interpolation techniques are listed here in terms of optional pre-processing of data prior to or during the HRGB reconstruction or deconstruction.)

It is known in the art that ramp filters are sometimes fine-tuned and adjusted based on a particular data set, since different data sets can exhibit different amounts and types of noise, signal, etc.

The '737 and '114 priority documents disclose using the HRGB method for general data processing. They also disclose using the HRGB method for processing and analyzing general signal data, such as digital signals and analog signals (including in cases where Analog-to-Digital conversion is applied to digitize the analog data), and such as electronic or wireless signals. It is noted that signal data is known in the art as comprising 1D, 2D, 3D, or etc., data.

It is known in the art that FS data and/or IFS data can be modified in particular contexts, including combining multiple FS data sets, in the context of data processing, such as for filtering, match filtering, correlation, auto-correlation, cross-correlation, convolution, etc. The HRGB's FS or IFS data can of course be similarly processed prior to, during, etc., the implementation of the HRGB method's steps. This falls in the category of pre-processing and/or pre-conditioning of the data, as was defined and discussed in the priority documents.

Omitting some or all of the region scaling factors, E is in the scope of the '114 document's claims and the present application's claims, since the specific case $E_i=1$ was disclosed, which of course has the same effect as omitting the corresponding E term or terms in the HRGB equations.

Omitting some of the preferred or computed data is explicitly in the scope of the '114 document's claims and the present application's claims. For example, in industrial applications the imaginary-number portions of the complex-number data are sometimes omitted. This is also, in addition, reflected in the priority document's and present application's disclosures explicitly stating that data, such as the computed color data, can be translated to non-complex numbers as desired.

Since the HRGB method can process N-dimensional data, data compression (such as for multi-media) is not limited to the typical 2D data groups—in contrast to typical compression techniques which for example compress each 2D color channel separately—but can compress simultaneously across multiple dimensions (such as by treating the color channels as a multi-dimensional group). This compression can be applied to a subset or portion of the multi-media data (such as in JPEG compression), or can be applied to the entire multi-media data (such as by doing IFS to FS deconstruction on the entire image, either on each color channel or across the full set of color channels).

As was stated in the '114 priority document, frequency-space exhibits (in theory, but not always in practice) symmetry about the origin, conjugate symmetry, and periodicity. As was stated in the '114 priority document, this fact is to be considered, particularly in the context of competitor work-arounds of the patent claims.

13. Additional Comments and Disclosures in the Present Application

The '114 priority document explicitly listed uses such as remote sensing. As is known in the art, remote sensing includes a large number of fields and applications, including ground penetrating radar and synthetic aperture radar, which process, reconstruct, and/or deconstruct FS and IFS data. The '114 priority document explicitly lists known problems in the related arts, including the problems of gridding, iteration, interpolation, etc. Gridding and interpolation are known bottlenecks in the fields of remote sensing, affecting both Fourier-based and gridding-based reconstructions, and back-projection-based and interpolation-based reconstructions. As was stated in the '737 and '114 priority documents, the HRGB method does not rely on gridding and interpolation (except in optional cases), while offering arbitrarily-high resolutions and arbitrarily-high parallelizations. It is noted that common remote sensing applications such as synthetic aperture radar frequently rely on polar and radial data, similar to CT data, and it is often a thin section of data which is in contrast to CT data which is typically a larger section of FS. In practice, SAR is often accomplished with Fourier techniques, since at large distances the SAR data is nearly Cartesian. Since the HRGB method allows non-uniform data, SAR data is not required to exhibit such nearly-Cartesian properties. It is noted here that SAR data often does not necessarily require density-compensation. It is also noted here that, as is known in the art, FS data can often be reconstructed in subsections. For example, CT or SAR data can be reconstructed in sections, and then combined such as by summing.

14. Additional Comments and Disclosures in the Present Application

The '737 and '114 priority documents refer to the wide range of applications known in the related arts, regarding FS and IFS, and reconstructions and deconstructions, including in the contexts of medical, industrial, scientific, and multimedia data applications. Some specific examples are listed in the '737 and '114 priority documents, for exemplary applications of data reconstructions and deconstructions. Exemplary uses of deconstructions included molecular analysis (in addition to reconstructions). Furthermore, additional examples of deconstructions (in addition to reconstructions) known in the related arts, include: MEG (magnetoencephalography), EEG (electroencephalography), FTIR (Fourier transform infrared spectroscopy), chemical analysis in general, spectroscopy, etc. Data processing in the context of optical coherence tomography (OCT) is an additional application.

In the context of data compression, the present disclosures can of course be used in combination with other techniques. For example, iteration techniques can allow a user to test or delete or alter data set items, by comparing the resulting reconstructions or deconstruction with a test case or set of metrics. For example, a data set can be reduced by determining which data can be omitted without affecting the resulting reconstruction or deconstruction. For example, an image can be compressed in this way, such that the data set is reduced while allowing the uncompressed image to yield a desired amount of accuracy. Compressed sensing approaches can also be used in conjunction with the disclosed techniques, such as in the context of data compression.

15. Additional Comments and Disclosures in the Present Application

Data reconstruction and deconstruction is also known in the fields of digital and computer-generated holography. A possible application is as follows. LCD screens (and/or related types of apparatuses) typically resemble holographic plates (that is, a combination of clear and opaque or non-clear areas), and hence a (preferably fine-resolution) diffraction, interference, or Fourier pattern can be generated in real time, while the LCD screen is lit with a holographic light source, such as a laser. In a preferred embodiment, this is performed in combination with lenses, such as those used in the holographic arts. As a particular example, the LCD screen's typical back light can be replaced with a laser source (or holographic light source in general) that lights the LCD screen instead of a typical holographic plate. The screen's data can display the computational results of the HRGB method, either computed in real time, or pre-computed but displayed, preferably in real time, on the display screen. Similarly, the HRGB method's parallelization can yield quickly-generated and/or large-sized holographic patterns, which can then be transferred to holographic media such as plates. Such techniques are known in the holographic arts, but now are used in conjunction with the HRGB method's computations. Similarly, the computed patterns can be transferred to media such as a film strip, and can thus be played as a real-time film, where the film projector's light source is replaced by a laser or similar holographic light source. In addition, since the HRGB's output has arbitrarily-high resolution, this will allow outputting of high-resolution and detailed FS data or holographic data.

It is noted here that remote sensing, which is typically performed with Fourier-type reconstructions and deconstructions or with back-projection techniques, was first performed with lasers, lenses, and holographic media techniques, rather than with digital computations.

16. Additional Comments and Disclosures in the Present Application

Data reconstruction and deconstruction is also known in the art as applying to data this is not "strictly" image, audio, video, etc., data. For example, it is also known for applications in molecular analysis (mentioned in the '737 and '114 priority documents), general signals and signal analysis and processing (mentioned in the '737 and '114 priority documents). Furthermore, additional examples of reconstructions and deconstructions that do not strictly process image, audio, or video, etc., data, include, as is known in the art: efficient polynomial multiplication and calculations (traditionally Fourier based), long integer multiplication (traditionally Fourier based), protein analysis, etc. As was discussed in the priority document, the phrase image-audio-video-space is used as a general term that applies to inverse frequency-space in general, and is not limited to these types of multi-media data specifically, due to computational equality in the context of reconstructions and deconstructions. For example, molecular analysis or FTIR does not strictly constitute such multi-media data, but the HRGB method's deconstructions can be used.

17. Additional Comments and Disclosures in the Present Application

As was mentioned in the '737 and '114 priority documents, discrete data is preferably interpolated in certain cases, such as when extra data is required or desired. This is particularly applicable in the context of deconstructions, such as with signal or multi-media deconstructions.

As was discussed in detail in the '737 and '114 priority documents, the HRGB method can "zoom in" to an area of interest. It is noted here that since the outputted data is, in such cases, limited to a sub-region, the dynamic range computations are of course easier for that sub-region, since the dynamic range of the outputted data does not need to be balanced with the rest of the full set of output data.

A brief listing of the unique features and special features of the HRGB method is as follows: dual functionality (reconstructions and deconstructions with the same method steps), arbitrarily-sized outputs and arbitrary output resolutions (a feature not known in the background art), computation with arbitrary amounts of parallelization (arbitrarily scalable) for fast computations, accurate reconstructions and deconstructions (not limited by errors due to gridding and/or interpolation, unlike common techniques in the background art), outputs that feature large dynamic range, reconstructions or deconstructions on non-uniform data in addition to uniform data (non-uniform data offers the biggest computational challenges in the background art), arbitrary choices of starting-space data and coordinates and arbitrary choices of target-space data and coordinates (which also allows non-rectilinear outputs, such as non-rectilinear output data in multi-media compression applications), and "zooming in" to areas of interest (since the starting and target coordinates are arbitrary).

It is noted here that the summations in the claims (in the '114 priority document and in the present CIP application) use indices that are defined as sequential integers starting at 1. For claiming purposes, it is intended that the inputted "sample-point component numbers" are indexed in this way, regardless of how the user chooses to refer to them. (That is, the emphasis is on the data processing steps, not on the choice of subscripts and indexes.) That is, the inputted kx-notated "sample-point component numbers" are indexed as $kx_1$, $kx_2$, $kx_3$, etc., and the $ky_{i,z}$ numbers are similarly indexed sequentially from i=1 and z=1. Competitor work-arounds that try to re-index the inputted data, such as −1, −2, −3, etc., are intended as within the scope of the present invention, since the present invention's numbering of data is affirmed regardless of the user's choice.

The claims in the '114 priority document and in the present CIP application refer to complex-number data. It is noted here that real numbers and integer numbers are considered subsets of the complex numbers, as in the rules of algebra. That is, real numbers and integer numbers are within the scope of the claims.

In the present application's claims, the phrase "wherein one of" implies "wherein at least one of", as is common in claims drafting.

18. Additional Comments and Disclosures in the Present Application

It is common in the background art to reconstruct and deconstruct data so that it is within the typical Fourier-defined square or rectangular regions, as defined by the rules of Fourier space, and therefore circular sets of data are often arranged as an inscribed circle in the Fourier region. In contrast, the HRGB's flexibility allows circular sets of data that are circumscribed outside the typical Fourier region, or to process and establish data in a larger circular region or larger square or rectangular region. Arbitrary starting and target points are a key feature of the HRGB method.

In the context of multi-media compression, the FS data points outputted after deconstruction can be grouped or sequenced. For example, if a web browser has its quality setting set, then a web transfer of data can transmit a corresponding number of groups of FS data points. Or, the web transfer can transmit a number of FS data points according to a pre-set sequence. The larger the number of data groups, or the longer the sequence of data, the web browser (or data recipient in general) can obtain a corresponding amount of FS information, for the decompression/reconstruction step. Preferably, the data groups or data sequences are arranged such that the uncompressed/reconstructed multi-media quality increases proportionally as the number of groups or the length of sequence increases. For example, a low quality choice could result in a rough but acceptable multi-media reconstruction. A high quality choice could result in the complete data set.

In the context of JPEG image compression (similarly applied to multi-media compression in general), current techniques typically cluster adjacent image points or pixels as a single color, in each of the color channels. It is then these clustered colors that are data compressed, rather than compressing the colors of each pixel in the cluster. (It is noted here that, as in the art, including in the context of JPEG compression, the term color channel is defined loosely, since it often refers to intensities, etc., rather than actual spectral colors.) A new technique is as follows. In each color channel (loosely defined as in the art), the data is clustered in the shape of a "plus", which is a set of five adjacent pixels, and the cluster's color is the average or weighted average of the colors of the five pixels in the cluster. In each color channel, the "pluses" are tiled. The different color channels can use the same tiling pattern, or preferably, each color channel has a tiling pattern that is slightly offset from the prior color channel, such as by an offset of a single pixel. The common data compression techniques are then applied to these color clusters, rather than to the typical color clusters.

What is claimed is:

1. A method for data reconstruction or deconstruction, comprising:

(a) acquiring, by inputting into a processing device or storing in a memory, a starting-space data set comprising a plurality of N-dimensional starting-space sample points selected by a user or a computer from an acquired image, audio, video, or molecular analysis data superset, wherein each N-dimensional starting-space sample point comprises a set of associated sample-point component numbers, each set of sample-point component numbers notated herein as $\{k_x, k_y, k_3, k_4, k_5, \ldots, k_N; a, b\}$, and wherein starting-space is either frequency-space or inverse frequency-space;

(b) applying at least one density-compensation function, by calculating on a processor or storing in the memory, at least one additional starting-space data value, wherein each additional starting-space data value comprises a complex number computed based on at least one sample-point component number in the starting-space data set;

(c) calculating, on the processor, for each of at least one user-selected or computer-selected x-coordinate $p_x$ in target-space, an associated horizontal key res1 comprising at least one horizontal key element, wherein target-space is frequency-space when starting-space is inverse frequency-space and is inverse frequency-space when starting-space is frequency-space, and wherein each horizontal key element is notated as $res1_i$ and comprises at least one term of the sum:

$$\sum_{z=r_1}^{r_2} (e^{j2\pi k y_{i,z} E_1 p_x E_2} * \langle a_{i,z}, b_{i,z} \rangle)$$

wherein $j^2=-1$, index z is a positive integer, and $r_1=1$ and $r_2=L_i$, wherein $L_i$ is a number of $k_y$ values paired with at least one of the $k_x$-notated values in the starting-space data set, and further wherein $E_1$ and $E_2$ are each a region scaling factor, $ky_{i,z}$ is one of the sample-point component numbers in the starting-space data set, $\langle a_{i,z}, b_{i,z} \rangle$ is one of a plurality of complex-number starting-space data values in the starting-space data set, and wherein * represents complex-number multiplication;

(d) calculating, on the processor, for each of at least one user-selected or computer-selected target-space point $(p_x, p_y)$ comprising a current target-space x-coordinate $p_x$ and a current target-space y-coordinate $p_y$, a color, wherein the color comprises at least one term of the sum:

$$\sum_{i=r_3}^{r_4} (e^{j2\pi p_y E_5 k x_i E_6} * res1_i)$$

wherein $j^2=-1$, index i is a positive integer, $r_3=1$ and $r_4=n$, wherein n is a number of $k_x$ values in the starting-space data set, and further wherein $E_5$ and $E_6$ are each a region scaling factor, $kx_i$ is one of the sample-point component numbers in the starting-space data set, $res1_i$ is one of the horizontal key elements associated with at least one of the horizontal keys, and wherein * represents complex-number multiplication; and (e) forming, by storing in the memory, outputting to a display device, storing on a storage device, or outputting to an output device, target-space data comprising at least one of the computed colors, thereby generating target-space data having a resolution corresponding to a number or density of the selected target-space points.

2. The method of claim 1, wherein one of the at least one density-compensation function is a ramp filter, Voronoi weighted filter, modified ramp filter, apodized ramp filter, Hanning/Hann filter, Butterworth filter, ramp-Hanning filter, ramp-Hamming filter, Parzen filter, Hamming filter, Shepp-Logan filter, Cosine filter, or square root of a ramp filter.

3. The method of claim 1, wherein one of the at least one density-compensation function is defined as a function of the square root of the distance between at least two starting-space coordinates.

4. The method of claim 1, wherein one of the at least one density-compensation function is defined as a function of the distance between at least two starting-space coordinates.

5. A system for reconstructing or deconstructing data, comprising:
(a) a processing device configured to acquire, by way of an input interface, a starting-space data set comprising a plurality of N-dimensional starting-space sample points selected by a user or a computer from an acquired image, audio, video, or molecular analysis data superset, wherein each N-dimensional starting-space sample point comprises a set of associated sample-point component numbers, each set of sample-point component numbers notated herein as $\{k_x, k_y, k_3, k_4, k_5, \ldots, k_N; a, b\}$, and wherein starting-space is either frequency-space or inverse frequency-space;
(b) a processor configured to calculate, for each of at least one user-selected or computer-selected x-coordinate $p_x$ in target-space, an associated horizontal key res1 comprising at least one horizontal key element, wherein target-space is frequency-space when starting-space is inverse frequency-space and is inverse frequency-space when starting-space is frequency-space, and wherein each horizontal key element is notated as res1 and comprises at least one term of the sum:

$$\sum_{z=r_1}^{r_2} (e^{j2\pi k y_{i,z} E_1 p_x E_2} * \langle a_{i,z}, b_{i,z} \rangle)$$

wherein $j^2=-1$, index z is a positive integer, and $r_1=1$ and $r_2=L_i$, wherein $L_i$ is a number of $k_y$ values paired with at least one of the $k_x$-notated values in the starting-space data set, and further wherein $E_1$ and $E_2$ are each a region scaling factor, $ky_{i,z}$ is one of the sample-point component numbers in the starting-space data set, $\langle a_{i,z}, b_{i,z} \rangle$ is one of a plurality of complex-number starting-space data values in the starting-space data set, and wherein * represents complex-number multiplication, and further configured to calculate, for each of at least one user-selected or computer-selected target-space point $(p_x, p_y)$ comprising a current target-space x-coordinate $p_x$ and a current target-space y-coordinate $p_y$, a color, wherein the color comprises at least one term of the sum:

$$\sum_{i=r_3}^{r_4} (e^{j2\pi p_y E_5 k x_i E_6} * res1_i)$$

wherein $j^2=-1$, index i is a positive integer, $r_3=1$ and $r_4=n$, wherein n is a number of $k_x$ values in the starting-space data set, and further wherein $E_5$ and $E_6$ are each a region scaling factor, $kx_i$ is one of the sample-point component numbers in the starting-space data set, $res1_i$ is one of the horizontal key elements associated with at least one of the horizontal keys, and wherein * represents complex-number multiplication; and (c) a memory configured to apply at least one density-compensation function, by storing at least one additional starting-space data value, wherein each additional starting-space data value comprises a complex number computed based on at least one sample-point component number in the starting-space data set,
and further configured to form target-space data by storing at least one of the computed colors, thereby generating target-space data having a resolution corresponding to a number or density of the selected target-space points.

6. The system of claim 5, wherein one of the at least one density-compensation function is a ramp filter, Voronoi weighted filter, modified ramp filter, apodized ramp filter, Hanning/Hann filter, Butterworth filter, ramp-Hanning filter, ramp-Hamming filter, Parzen filter, Hamming filter, Shepp-Logan filter, Cosine filter, or square root of a ramp filter.

7. The system of claim 5, wherein one of the at least one density-compensation function is defined as a function of the square root of the distance between at least two starting-space coordinates.

8. The system of claim 5, wherein one of the at least one density-compensation function is defined as a function of the distance between at least two starting-space coordinates.

9. A non-transitory computer-readable storage device storing instructions that when executed by a computer cause the computer to perform a method for using a computer system to reconstruct or deconstruct data, the method comprising:
(a) acquiring, by inputting into a processing device or storing in a memory, a starting-space data set comprising a plurality of N-dimensional starting-space sample points selected by a user or a computer from an acquired image, audio, video, or molecular analysis data superset, wherein each N-dimensional starting-space sample point comprises a set of associated sample-point component numbers, each set of sample-point component numbers notated herein as $\{k_x, k_y, k_3, k_4, k_5, \ldots, k_N; a, b\}$, and wherein starting-space is either frequency-space or inverse frequency-space;
(b) applying at least one density-compensation function, by calculating on a processor or storing in the memory, at least one additional starting-space data value, wherein each additional starting-space data value comprises a complex number computed based on at least one sample-point component number in the starting-space data set;
(c) calculating, on the processor, for each of at least one user-selected or computer-selected x-coordinate $p_x$ in target-space, an associated horizontal key res1 comprising at least one horizontal key element, wherein target-space is frequency-space when starting-space is inverse frequency-space and is inverse frequency-space when starting-space is frequency-space, and wherein each horizontal key element is notated as res1$_i$ and comprises at least one term of the sum:

$$\sum_{z=r_1}^{r_2} (e^{j2\pi k y_{i,z} E_1 p_x E_2} * \langle a_{i,z}, b_{i,z} \rangle)$$

wherein $j^2=-1$, index z is a positive integer, and $r_1=1$ and $r_2=L_i$, wherein $L_i$ is a number of $k_y$ values paired with at least one of the $k_x$-notated values in the starting-space data set, and further wherein $E_1$ and $E_2$ are each a region scaling factor, $ky_{i,z}$ is one of the sample-point component numbers in the starting-space data set, $<a_{i,z}, b_{i,z}>$ is one of a plurality of complex-number starting-space data values in the starting-space data set, and wherein * represents complex-number multiplication;

(d) calculating, on the processor, for each of at least one user-selected or computer-selected target-space point $(p_x, p_y)$ comprising a current target-space x-coordinate $p_x$ and a current target-space y-coordinate $p_y$, a color, wherein the color comprises at least one term of the sum:

$$\sum_{i=r_3}^{r_4}(e^{j2\pi p_y E_5 kx_i E_6}*res1_i)$$

wherein $j^2=-1$, index i is a positive integer, $r_3=1$ and $r_4=n$, wherein n is a number of $k_x$ values in the starting-space data set, and further wherein $E_5$ and $E_6$ are each a region scaling factor, $kx_i$ is one of the sample-point component numbers in the starting-space data set, $res1_i$ is one of the horizontal key elements associated with at least one of the horizontal keys, and wherein * represents complex-number multiplication; and     (e) forming, by storing in the memory, outputting to a display device, storing on a storage device, or outputting to an output device, target-space data comprising at least one of the computed colors, thereby generating target-space data having a resolution corresponding to a number or density of the selected target-space points.

10. The computer-readable storage device of claim 9, wherein one of the at least one density-compensation function is a ramp filter, Voronoi weighted filter, modified ramp filter, apodized ramp filter, Hanning/Hann filter, Butterworth filter, ramp-Hanning filter, ramp-Hamming filter, Parzen filter, Hamming filter, Shepp-Logan filter, Cosine filter, or square root of a ramp filter.

11. The computer-readable storage device of claim 9, wherein one of the at least one density-compensation function is defined as a function of the square root of the distance between at least two starting-space coordinates.

12. The computer-readable storage device of claim 9, wherein one of the at least one density-compensation function is defined as a function of the distance between at least two starting-space coordinates.

* * * * *